United States Patent [19]

Sugayama et al.

[11] Patent Number: 5,321,851
[45] Date of Patent: Jun. 14, 1994

[54] RADIO RECEIVER COMPRISING AUTOMATIC GAIN CONTROLLING FUNCTION

[75] Inventors: Sakae Sugayama, Ora; Hisao Ishii, Ashikaga; Shinichi Yamazaki, Ora, all of Japan

[73] Assignee: Sanyo Electric Co., Ltd., Moriguchi, Japan

[21] Appl. No.: 612,551

[22] Filed: Nov. 13, 1990

[30] Foreign Application Priority Data

Nov. 15, 1989 [JP] Japan ................... 1-296933
Nov. 17, 1989 [JP] Japan ................... 1-300247

[51] Int. Cl.$^5$ ............................................. H04B 7/00
[52] U.S. Cl. ........................... 455/161.3; 455/251.1; 455/245.1; 455/246.1
[58] Field of Search ............... 455/232.1, 234.1, 245.1, 455/246.1, 245.2, 251.1, 197.1, 197.3, 296, 236.1, 247.1, 161.2, 161.3

[56] References Cited

U.S. PATENT DOCUMENTS

| | | | |
|---|---|---|---|
| 3,825,838 | 7/1974 | Mayle | 325/470 |
| 4,455,681 | 6/1984 | Wile | 455/246.1 |
| 4,955,077 | 9/1990 | Sugayama | 455/197 |

FOREIGN PATENT DOCUMENTS 2004428 3/1979 United Kingdom .

OTHER PUBLICATIONS

Patent Abstracts of Japan, vol. II, #284 (E-540) Sep. 12, 1987 & JP-A-62-82812 (Matsushita) Toda Akitoshi.

Patent Abstracts of Japan, vol. 12, No. 193 (E-617) Jun. 4, 1988, & JP-A-62 294 316 (Sanyo) Dec. 21, 1987.

Primary Examiner—Reinhard J. Eisenzopf
Assistant Examiner—Philip J. Sobutka
Attorney, Agent, or Firm—Darby & Darby

[57] ABSTRACT

A cross modulation interference free AM radio receiver with precise channel selection includes an RF amplifying circuit for a radio frequency (RF) signal incoming through an antenna (1; 101) to output a wide band RF signal and an automatic gain control (AGC) circuit (7; 107) for controlling the gain of the RF amplifying circuit in accordance with the field strength of the wide band RF signal. A circuit (3, 4, 5, 6; 109, 110, 111, 112, 113) as provided for extracting a desired signal from the wide band RF signal, and a first control circuit (81; 114, 116, 118) for reducing the AGC effect of the AGC circuit in a decrease in the field strength of the desired signal which results in an increase in the amplification rate of the RF amplifying circuit. A second control circuit (8) makes the first control circuit non-operative in response to an instruction of an automatic channel selection at which time the AGC circuit performs an AGC operation only in accordance with the field strength of a wide band RF signal. A third control circuit (118) sets the AGC circuit in forced AGC state where the gain of the RF amplifying circuit is minimized when the field strength of the desired signal is above a first reference value, and a sensitivity switching circuit (119) reduces the sensitivity of the AGC circuit to the wide band RF signal field strength when the field strength of the desired signal is below a second reference value.

10 Claims, 4 Drawing Sheets

RADIO RECEIVER COMPRISING AUTOMATIC GAIN CONTROLLING FUNCTION

BACKGROUND OF THE INVENTION

1. Field of the Invention

The present invention relates generally to radio receivers, and in particular, to an improvement in an automatic gain controlling function of a radio receiver. More specifically, the present invention relates to an improvement in an automatic gain control system of a radio receiver comprising an automatic channel selecting function.

2. Description of the Background Art

Such an AM radio receiver as shown in FIG. 1 is well known. In FIG. 1, the radio receiver comprises an RF amplifying circuit 2 for amplifying an incoming radio frequency (RF) signal through an antenna 1, and a mixing circuit 3 for mixing the RF signal with a local oscillating signal from a local oscillating circuit 4 to output an intermediate frequency signal (IF signal) of a fixed frequency.

Local oscillating circuit 4 changes the oscillating signal frequency in response to a tuning frequency control signal VT for determining a desired channel frequency.

Mixing circuit 3 outputs the intermediate frequency signal by utilizing the beating by oscillating signal and the wide band RF signal. The intermediate frequency signal accordingly has a band width entered at a fixed frequency (for example 450 KHz). The intermediate frequency signal generated by mixing circuit 3 based on the wide band RF signal is referred to as a wide band IF signal. Mixing circuit 3 may include a first mixing circuit for generating a first intermediate frequency (IF) signal having a center frequency of, for example, 10.7 MHz from the wide band RF signal and a second mixing circuit for converting the first IF signal to a second IF signal of 450 KHz, for example. In this case, the first mixing circuit receives a variable oscillating signal and the second mixing circuit receives an oscillating signal of a fixed frequency.

The radio receiver further includes an IF amplifying circuit 5 for amplifying the IF signal from mixing circuit 3 and a detection circuit 6 for detecting the output signal of IF amplifying circuit 5 (the signal of a desired channel), to output a low frequency signal. The output of detection circuit 6 is applied to a down-stream low frequency amplifying circuit wherein it is reproduced by a speaker.

IF amplifying circuit 5 includes an IF tuning circuit. A signal passing through IF tuning circuit has its band limited. A signal at the input of IF amplifying circuit 5 is referred to as a wide band IF signal, while a signal at output thereof is referred to as a narrow band IF signal.

The radio receiver further includes a gain control (AGC) circuit 7 for compensating for a fluctuation of an incoming RF signal from antenna 1 to substantially fix the output level of RF amplifying circuit 2. AGC circuit 7 controls the gain of RF amplifying circuit 2 in response to the level of the wide band IF signal from mixing circuit 3. Mixing circuit 3 simply mixes the RF signal with an oscillating signal from a local oscillator 4, whereby the level (strength) of the wide band IF signal is proportional to a field strength of the incoming RF signal at the antenna 1. As a result, with the amplification of the incoming RF signal controlled in response to the wide band IF signal, it is possible to control gain in response to the level (reception field strength) of the incoming RF signal. The circuit is hereinafter referred to as a wide band AGC circuit which controls the gain of RF amplifying circuit 2 by using a wide band IF signal.

The wide band AGC circuit 7 decreases the gain of RF amplifying circuit 2 when the level of the wide band IF signal increases. Wide band AGC circuit 7 increases the gain of RF amplifying circuit 2 when the level of the wide band IF signal decreases.

When the level of the wide band IF signal increases, the gain of RF amplifying circuit 2 is reduced to lower the level of the wide band RF signal applied to mixing circuit 3, thereby preventing saturation of mixing circuit 3 to improve a cross modulation interference characteristic. However, wide band AGC circuit cause several problems. More specifically, when the RF signal includes a strong interference signal and a weak desired signal (desired channel frequency signal), the output of mixing circuit 3 includes a signal obtained by frequency-converting the strong interference signal. Wide band AGC circuit 7 controls the gain of RF amplifying circuit 2 in response to the strong interference signal. As a result, the desired signal component is suppressed to reduce sensitivity to the desired signal.

Some radio receivers have an automatic channel selecting function. At an automatic channel selection, a tuning frequency (the control signal VT in the arrangement of FIG. 1) is successively changed corresponding to interchannel steps. When a narrow band IF signal level (reception field strength) exceeds a predetermined reference value, the determination is made that the channel is selected.

A tuning frequency is fixed to the frequency exceeding the predetermined reference value. For automatic channel selection, a level detector is required which detects a level of a narrow band IF signal. Such a level detector exhibits an input/output characteristic shown in FIG. 2.

In FIG. 2, the abscissa denotes a strength of an incoming RF signal through antenna 1 and the ordinate denotes an output of a level detector. The curves I and II encircled by the doted lines show changes of an output $V_{SM}$ of the level detector when a tuning frequency is changed at an incoming RF signal levels V1 and V2, respectively.

In order to further improve the cross modulation characteristic of the radio receiver shown in FIG. 1, proposed is a radio receiver using a wide band RF signal at a channel selection which uses a narrow band RF signal for a reception after the channel selection.

This radio includes an RF tuning circuit in an RF amplifying circuit. At a channel selection, the RF amplifying circuit outputs a wide band RF signal which is applied to a mixing circuit. After the channel selection, the RF tuning circuit is tuned to a selected channel frequency. The RF tuning circuit outputs an RF signal (narrow band RF signal) tuned to the selected channel frequency from the incoming RF signal, for application to the mixing circuit 5.

This radio receiver utilizes a wide narrow band RF signal for channel selection to eliminate tracking error. For reception after the channel selection, only a narrow band RF signal, that is, a tuned RF signal, is applied to the mixing circuit to suppress cross modulation interference caused due to an interference signal component included in the wide band RF signal.

The radio receiver has the mixing circuit receiving different signals at a channel selection and at a reception after the completion of the channel selection, thereby requiring a fine tuning of a tuning frequency after the channel selection.

The fine tuning circuit tunes the RF tuning circuit to the tuning frequency selected based on the wide band RF signal at the channel selection (referred to as a rough tuning). After the rough tuning, the tuning frequency of the RF tuning circuit is changed by a predetermined step. The RF tuning circuit is set to the tuning frequency providing the maximum reception field (narrow band IF signal level).

In this case, when a signal of a field strength below 95 dBμ is received, sufficient change is obtained as shown by the curve II in FIG. 2. However, when a strong field signal of a field strength above or equal to 95dBμ is received, the change is quite small so that accurate fine tuning can not be accomplished.

OBJECTS OF THE INVENTION

An object of the present invention is to provide a radio receiver capable of receiving a desired signal with high sensitivity.

Another object of the present invention is to provide a radio receiver allowing no strong field interference signal channel to be erroneously selected at an automatic channel selection.

A further object of the present invention is to provide a radio receiver allowing an automatic channel selection with high precision.

SUMMARY OF THE INVENTION

A first radio receiver according to the present invention includes an RF amplifying circuit for amplifying an incoming radio frequency (RF) signal through an antenna, and a wide band AGC circuit responsive to a signal indicative of a field strength of the RF signal for controlling the amplification rate of the RF amplifying circuit.

The first radio receiver further includes a circuit for determining a field strength of a desired signal from the RF signal, a control circuit for controlling AGC effect of the wide band AGC circuit in accordance with the field strength of the desired signal and circuitry for inhibiting the operation of the control circuit at channel selection.

A second radio receiver is provided according to the present invention which has a function of an automatic channel selection by changing an oscillating frequency of a local oscillating circuit in response to an instruction of an automatic channel selection and a function of stopping the automatic channel selection when the field strength of the received signal exceeds a predetermined value. At the stop of the automatic channel selection, the oscillating frequency is fixed.

The second radio receiver includes an RF tuning circuit having a tuning frequency set to a received signal frequency at a completion of a channel selection, a circuit for extracting a received signal from an output of the RF tuning circuit, and an adjusting circuit for fine adjusting a tuning frequency of the RF tuning circuit such that the received signal has the maximum field strength by changing the tuning frequency of the RF tuning circuit in response to the stop of the automatic channel selection.

The second radio receiver further includes a field strength detecting circuit for detecting the field strength of a received signal, an AGC circuit for minimizing the gain of the RF amplifying circuit in response to detection of the field strength of the received signal exceeding a first reference value by the field strength detecting circuit, and a circuit for reducing sensitivity of the AGC circuit in response to a detection of the field strength of the received signal being below a second reference value by the field strength detecting circuit.

With the above-described arrangement, the gain of the RF amplifying circuit is controlled in response to field strengths of the wide band RF signal and the received signal to prevent cross modulation interference and suppression of sensitivity to the received signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In order to overcome the drawbacks in the gain control by using only a wide band IF signal, a wide band AGC signal should be controlled in accordance with the field strength of a received signal (desired signal). The wide band AGC signal is an automatic gain control (AGC) signal generated in response to a wide band IF signal or a wide band RF signal.

Figure 1:
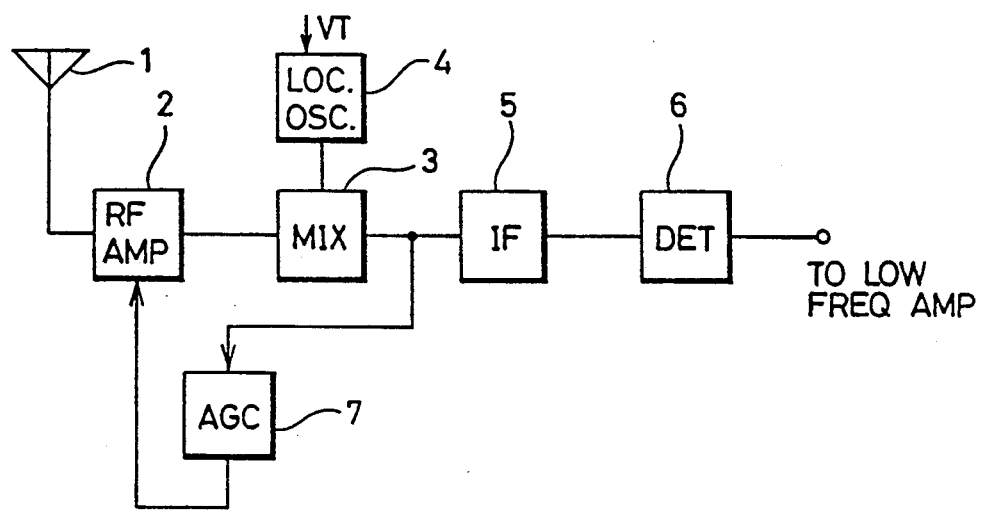
FIG. 1 shows an arrangement of a conventional radio receiver.
Figure 3:
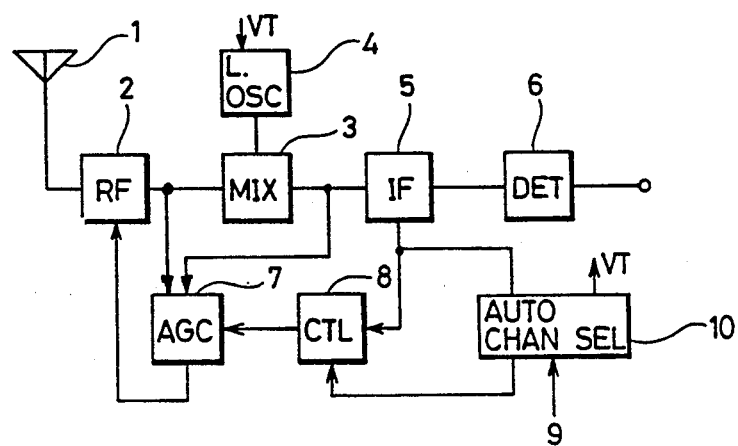
FIG. 3 shows an arrangement of a radio receiver according to one embodiment of the present invention.

FIG. 3 shows an arrangement of a radio receiver according to one embodiment of the present invention. In FIG. 3, the same reference numerals are allotted to the corresponding components to those in the radio receiver shown in FIG. 1.

In FIG. 3, the radio receiver comprises an automatic channel selection circuit 10 for executing an automatic channel selecting operation in response to an automatic channel selection instructing signal applied through an input terminal 9 and a control circuit 8 for controlling the degree of gain control of a wide band AGC circuit 7 in response to a control signal from automatic channel selection circuit 10.

In the arrangement shown in FIG. 3, wide band AGC circuit 7 receives a wide band IF signal supplied from a mixing circuit 3 and it may receive RF signal from an RF amplifying circuit 2. An operation thereof will be described in the following.

When an automatic channel selection instructing signal is applied to automatic channel selection circuit 10 through input terminal 9, the radio receiver enters a channel selection state. Automatic channel selection circuit 10 performs a channel selecting operation in response to the automatic channel selection instructing signal and applies a stop signal to control circuit 8.

Control circuit 8 stops its controlling operation being in response to the stop signal. That is, control circuit 8 stops the control of the wide band AGC operation in response to a narrow band IF signal. Therefore, wide band AGC circuit 7 controls the gain of RF amplifying circuit 2 through use of IF signal (or a wide band RF signal) from mixing circuit 3.

Automatic channel selection circuit 10 successively changes a tuning frequency control signal VT to monitor a level of a narrow band IF signal. When the level of the narrow band IF signal exceeds a reference value, the automatic channel selection circuit makes the determination that a desired signal is selected, thereby stopping the change of the tuning frequency control signal VT.

As the foregoing, by allowing a wide band AGC to function in response to only IF (or RF) signal in a channel selection state, wide band AGC circuit 7 effectively suppresses a strong field interference signal to prevent saturation of mixing circuit 3.

The suppressed level of the interference signal by wide band AGC circuit 7 prevents a selection of the interference signal channel.

Upon completion of a channel selection by automatic channel selection circuit 10, radio receiver enters a reception state. Automatic channel selection circuit 10 stops applying the stop signal to control circuit 8 in response to the completion of the channel selection. Upon the stop of application of the stop signal, control circuit 8 controls the operation of wide band AGC circuit 7 in response to the narrow band IF signal from IF amplifying circuit 5. As the narrow band IF signal level increases, control circuit 8 controls the AGC effect of wide band AGC circuit 7 to sufficiently lower the gain of RF amplifying circuit 2.

As the narrow band IF signal level decreases, the AGC effect of wide band AGC circuit 7 is controlled so as not to reduce the gain of RF amplifying circuit 2. The gain of RF amplifying circuit 2 is therefore controlled in response to a reception signal level in a reception state, thereby preventing cross modulation of an interference signal such as an image signal to improve a two signal selection characteristic (selectivity).

Figure 4:
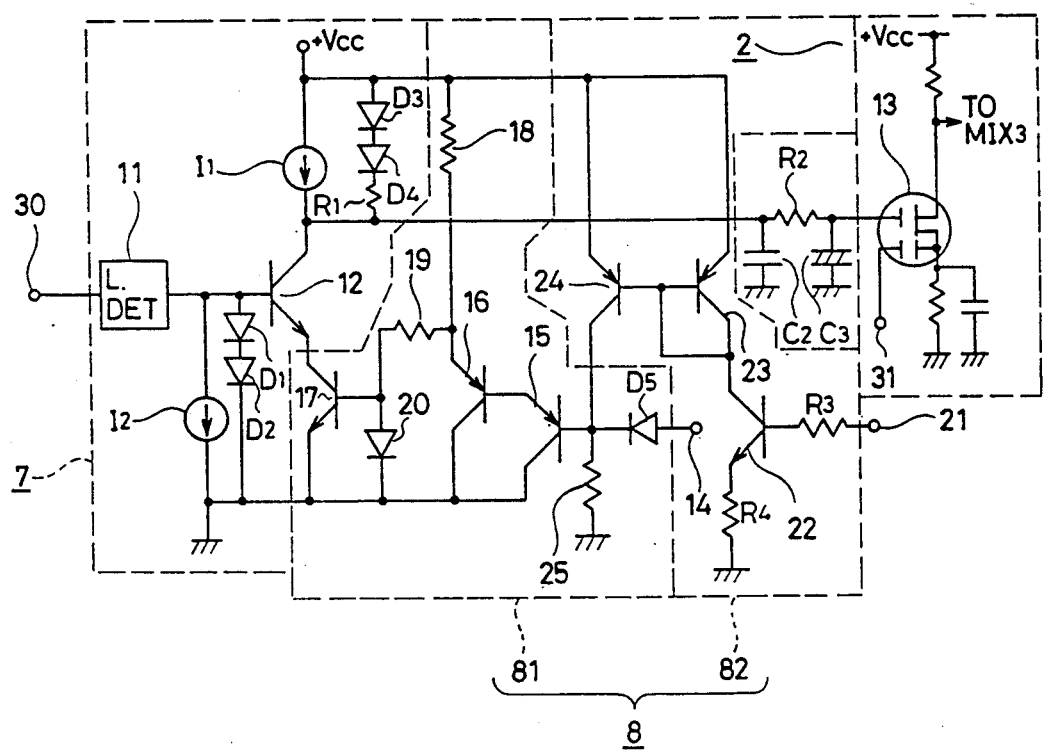
FIG. 4 shows one example of specific arrangements of the control circuit and the AGC circuit shown in FIG. 3.

FIG. 4 shows a specific arrangement of wide band AGC circuit 7 and control circuit 8 shown in FIG. 3. In FIG. 4, wide band AGC circuit 7 includes a level detection circuit 11 for detecting a level of a wide band IF signal applied through an input terminal 30 and an npn bipolar transistor 12 receiving the output of level detection circuit 11 at its base.

Level detection circuit 11 detects a wide band IF signal to obtain a level thereof. An npn bipolar transistor 12 amplifies the output of level detection circuit 11 to output an AGC signal from its collector.

Wide band AGC circuit 7 comprises series-connected diodes D1 and D2 for clamping the base potential of transistor 12, a constant current circuit I1 for supplying a constant current to the collector of transistor 12, a resistor R1 for producing an output potential at the collector of transistor 12, diodes D3 and D4 for preventing adverse effect of the high collector potential of transistor 12 on the power supply +Vcc and a constant current circuit I2 for extracting the base current of transistor 12.

Control circuit 8 comprises a first control circuit 81 for adjusting a gain control effect of wide band AGC circuit 7 in response to a narrow band IF signal or a reception field strength indicating signal from a terminal 14 and a second control circuit 82 for controlling the operation of first control circuit 81 in response to a stop signal applied through a terminal 21.

First control circuit 81 comprises an npn bipolar transistor 17 having a collector connected to the emitter of transistor 12 for controlling the collector current of transistor 12 and Darlington-connected pnp bipolar transistors 15 and 16 for controlling the base potential of transistor 17 in response to the reception field strength indicating signal from terminal 14.

Transistor 15 receives at its base through a diode D5 a reception field strength indicating signal applied through terminal 14. The base of transistor 15 is connected to a resistor 25 for applying a base potential to transistor 15. The resistor 25 is in parallel with diode D5.

Transistor 16 has an emitter connected to the base of transistor 17 through resistor 19 and also connected to power supply voltage +Vcc through a resistor 18. The base of transistor 16 is connected to the emitter of transistor 15.

Transistor 17 has it collector connected to the emitter of transistor 12. Diode 20 is connected between the base and the emitter of transistor 17 for applying a forward bias voltage therebetween.

Second control circuit 82 comprises an npn bipolar transistor 22 having a base receiving the stop signal applied to terminal 21 through a resistor R3 and an emitter connected to a ground potential through an emitter resistor R4, and pnp bipolar transistors 23 and 24 constituting a current mirror circuit whose current supply is controlled by transistor 22.

Transistor 23 has the base and the collector connected to the collector of transistor 22 and the emitter connected to the power supply voltage +Vcc. Transistor 24 has the base connected to the base of transistor 23 and the collector connected to the base of transistor 15. The same amount of current as that flowing through transistor 23 flows through transistor 24.

RF amplifying circuit 2 includes a double gate MOSFET (insulated gate type field effect transistor) 13. Double gate FET 13 has one gate electrode receiving an incoming RF signal through antenna 1 applied through a terminal 31 and the other gate electrode receiving an AGC signal from wide band AGC circuit 7.

A resistor R2 and capacitors C2 and C3 constitute a low pass filter. The charge potential of capacitor C3 determines an amplification rate of double gate FET 13, that is, the gain of RF amplifying circuit 2. The drain of (output node) of double gate FET 13 is connected to the power supply voltage +Vcc through a load resistor. Double gate FET 13 outputs RF signal which is applied to mixing circuit 3.

Operations thereof will be described.

First, the operation of wide band AGC circuit 7 will be described. The wide band IF signal applied to terminal 30 is level-detected by level detection circuit 11 and the level of IF signal is detected. When the output signal level of level detection circuit 11 is high, transistor 12 is deeply turned on to absorb a large collector current. When the collector current of transistor 12 exceeds the constant current supplied by constant current circuit I1, capacitor C3 is discharged to lower the charge potential. The charge potential of capacitor C3 determines the amplification rate of double gate FET 13. At this time, the amplification rate of double gate FET 13, that is, the amplification rate of RF amplifying circuit 2 decreases accordingly.

When the output signal level of level detection circuit 11 decreases, the collector current of transistor 12 is reduced, whereby capacitor C3 is charged by the constant current from constant current circuit I1 to increase the charge potential. As a result, the amplification rate of double gate FET 13 is increased to increase the gain of RF amplifying circuit 2.

The collector current amount of transistor 12 is controlled by the collector current with transistor 17 included in control circuit 8. An operation of the control circuit 8 will be described.

Input terminal 14 receives from IF amplifying circuit 5 the signal indicative of the field strength of the reception signal. When the level of the reception signal field strength instructing signal is low, transistors 15 and 16 are turned on. With transistors 15 and 16 being on, the base bias current flowing to resistor 19 is reduced to decrease the collector current which transistor 17 is capable of flowing.

In this state, even when the output signal level of level detection circuit 11 increases, transistor 12 can not flow therethrough the collector current corresponding to the increased level of output signal of level detection circuit 11. As a result, the charge potential of capacitor C3 does not decrease, so that the gain of RF amplifying circuit 2 is not so much lowered. That is, the AGC function of wide band AGC circuit 7 is restricted, and attenuation of an RF signal is limited. In other words, when a reception signal (a desired signal) level is low, the attenuation of the RF signal due to a wide band AGC function is limited, whereby a high level wide band RF signal is applied to mixing circuit 3.

When the reception signal field strength is extremely reduced, transistors 15 and 16 are very deeply turned on, whereby the current from resistor 18 all flows through transistor 16. As a result, transistor 17 is turned off to cut off the emitter current path of transistor 12. Capacitor C3 is therefore charged to the maximum charge potential with the constant current from constant current circuit I1 to maximize the amplification rate of double gate FET 13.

In other words, when the reception signal field strength is extremely small, no wide band AGC signal is generated and RF amplifying circuit 2 operates at a maximum gain, whereby the reception signal is sufficiently amplified.

When the field strength of the reception signal from IF amplifying circuit 5 is large, transistor 15 enters an off state. The shunting current at base resistor 19 of transistor 17 is reduced. Transistor 17 is deeply turned on, because a sufficient amount of base current is supplied and the base to the emitter thereof is biased in a forward direction by diode 20, thereby flowing therethrough all the collector current of transistor 12, which does not affect the AGC function of wide band AGC circuit 7.

That is, when the reception signal field strength is large, RF amplifying circuit 2 performs the gain control for the incoming RF signal in accordance with its level. Transistors 15 and 16 are turned on/off in response to the base potential of transistor 15. The base potential of transistor 15 is determined by the field strength indicating signal applied to terminal 14 and it also depends on the bias potential supplied by resistor 25. The bias potential supplied by resistor 25 depends on the collector current from transistor 24. The operation of second control circuit 82 determining the base-bias potential of transistor 15 will be described.

In an automatic channel selecting operation, input terminal 21 receives a stop signal of "H", for example, at a power supply voltage +Vcc level. At a reception, no stop signal is applied and input terminal 21 is set to a "L" such as a ground potential level.

When the stop signal "H" is applied to input terminal 21, transistor 22 is completely turned on to form a collector. In response to transistor 23 being turned on, transistor 24 is also turned on to supply the same amount of current to resistor 25 as that of the collector current of transistor 23. As a result, a voltage is developed across resistor 25 to increase the base potential of transistor 15, which in turn completely turned off irrespective of the level of the reception signal field strength indicating signal from input terminal 14.

That is, in a channel selection state, wide band AGC circuit 7 performs a wide band AGC operation with the maximum sensitivity. Therefore, in a channel selection state, an interference signal is satisfactorily suppressed, which prevents a selection of an interference signal channel.

In a reception state after the completion of the channel selection, no stop signal is applied to input terminal 21. That is, transistor 22 is completely turned off. Transistors 23 and 24 are accordingly turned off. With no current supplied to resistor 25 from transistor 24, the state of transistor 15 is determined by a reception signal field strength applied to input terminal 14. In this condition, the AGC function of wide band AGC circuit 7 is restricted in accordance with the reception signal field strength to achieve an optimum reception state.

Figure 5:
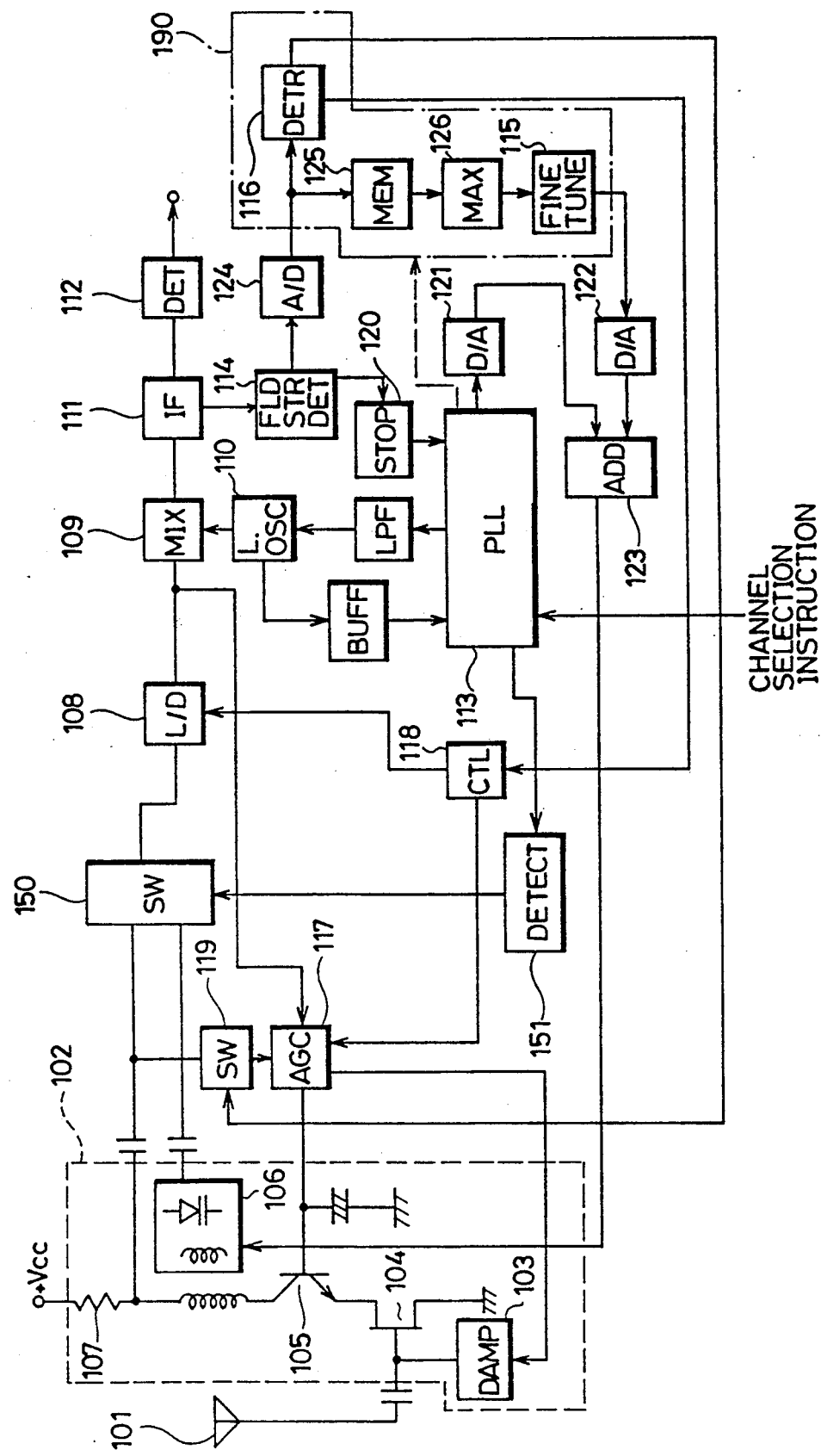
FIG. 5 shows an arrangement of a radio receiver according to another embodiment of the present invention.

FIG. 5 is the diagram showing the arrangement of the radio receiver according to another embodiment of the present invention. The radio receiver shown in FIG. 5 employs a wide band RF signal at a channel selection and a narrow band RF signal at a reception. The radio receiver further comprises a fine tuning function of fine tuning a selected tuning frequency.

Referring to FIG. 5, the radio receiver comprises an RF amplifying circuit 102 for amplifying an incoming RF signal through an antenna 101 to output a wide band RF signal and a narrow band RF signal, an AGC circuit 117 for adjusting the gain of RF amplifying circuit 102 in response to the wide band RF signal and the narrow band RF signal, and a control circuit 118 for controlling the AGC function of AGC circuit 117 based on a reception field strength.

RF amplifying circuit 102 includes an attenuation circuit 103 for attenuating the incoming RF signal through antenna 101 to prevent cross modulation caused by an excess input voltage, an amplifying element 104 for amplifying the incoming RF signal through antenna 101 and comprising a field effect transistor, an AGC transistor 105 comprising an npn bipolar transistor whose gain is controlled by the AGC signal from AGC circuit 117 and transmitting the amplified RF signal from amplifying element 104, an RF tuning circuit 106 which is a load of AGC transistor 105 and a resistor element 107, as an output load of AGC transistor, provided between RF tuning circuit 106 and a power supply voltage +Vcc.

RF tuning circuit 106 outputs a narrow band RF signal after the completion of the channel selection. The narrow band RF signal frequency is set by a tuning frequency control signal. Resistor element 107 produces a wide band RF signal.

The radio receiver further comprises a selection circuit 150 passing a wide band RF signal at a channel selection and passing a narrow band RF signal after the completion of the channel selection, a local/DX switching circuit 108 for adjusting an attenuation amount of the output of selection circuit 150, a mixing circuit 109 for mixing the output of local/DX switching circuit 108 with a local oscillating signal from a local oscillating circuit 110 to generate an IF signal, and an IF amplifying circuit 111 for amplifying an IF signal from mixing circuit 109.

The radio receiver further comprises a PLL (phase locked Loop) circuit 113 for changing the oscillating frequency of local oscillating circuit 110 in response to a channel selection instructing signal, a field strength detection circuit 114 for detecting the field strength indicating signal level from IF amplifying circuit 111, a stop circuit 120 for detecting whether the channel selection is made or not in response to the output of field strength detection circuit 114, and a fine tuning circuit 190 for fine tuning a tuning frequency (narrow band RF signal) in response to the output of field strength detection circuit 114.

Fine tuning circuit 190 comprises a microcomputer, for example, and includes a memory 125 for storing the output signal of field strength detection circuit 114, a maximum value detection circuit 126 for obtaining a maximum value of the data stored in memory 125, and a fine tuning control circuit 115 for outputting a fine tuning signal increasing at a predetermined step after the completion of the channel selection and continuously outputting a fine tuning signal corresponding to the maximum value detected by maximum value detection circuit 126.

The radio receiver further comprises an adding circuit 123 for adding a signal (rough tuning signal) corresponding to the selected channel frequency in channel selection and the fine tuning signal from fine tuning circuit 190 generated at the completion of the channel selection, a state detection circuit 151 for switching a connection path of selection circuit 150 in accordance with a channel selection start/stop state of PLL circuit 113, a control circuit 118 for switching the attenuation amount of local/DX circuit 108 in accordance with the field strength under reception and controlling the AGC function of AGC circuit 117 and a sensitivity switching circuit 119 for switching the sensitivity of AGC circuit 117 in accordance with the field strength under reception or of a desired signal level.

Both control circuit 118 and sensitivity switching circuit 119 receive a control signal from a control circuit 116 included in fine tuning circuit 190. Control circuit 116 generates a control signal in response to the output signal of field strength detection circuit 114 exceeding a first reference value and being below a second reference value.

A digital/analogue converter 121 is provided between PLL circuit 113 and one input of adder 123 and a digital/analogue converter 122 is provided between fine tuning circuit 190 and the other input of adding circuit 123. Operations thereof will be described.

Pressing an automatic channel selection button (not shown) generates an instruction of an automatic channel selection which is applied to PLL circuit 113. PLL circuit 113 enters an automatic channel selection state in response to the instruction of the automatic channel selection to start a channel selection. A channel selecting operation using PLL circuit 113 as a frequency synthesizer is commonly known and therefore no detailed description will be made here.

PLL circuit 113 enters an automatic channel selection state, which is detected by state detection circuit 151. This detection is made by detecting an instruction of changing an oscillating frequency control signal in PLL circuit 113.

On detecting the automatic channel selection state of PLL circuit 113, state detection circuit 151 sets selection circuit 150 in a first state. Selection circuit 150 in the first state allows a wide band RF signal to pass through, which RF signal is generated by resistor 107.

AGC circuit 117 applies an AGC signal to AGC transistor 105 in response to the wide band RF signal. A wide band AGC operation is carried out by the wide band RF signal.

The oscillating signal frequency from local oscillating circuit 110 changes in response to the output of PLL circuit 113.

As a result, the output signal level of mixing circuit 109 changes and the IF signal level from IF amplifying circuit 111 changes accordingly. The IF signal level is proportional to a reception signal field level is proportional to a reception signal field strength. Field strength detection circuit 114 detects the IF signal to output a field strength indicating signal. Stop circuit 120 compares the field strength indicating signal with a fixed reference value. Stop circuit 120 makes the determination that the channel selection is completed when the field strength indicating signal exceeds the fixed reference value, thereby outputting a stop signal.

PLL circuit 113 stops a change of the oscillating frequency in response to the stop signal. When state detection circuit 151 detects the stop of the change in the oscillating frequency, selection circuit 150 is set in a second state to pass a narrow band RF signal from RF tuning circuit 106.

PLL circuit 113 also outputs a digital signal corresponding to a tuning frequency at the completion of the channel selection in response to completion of the channel selection, that is, in response to the stop signal and applies the digital signal to D/A converting circuit 121. The digital/analogue converted signal from D/A converting circuit 121 is transmitted to RF tuning circuit 106 through adding circuit 123. RF tuning circuit 106 outputs a narrow band RF signal tuned to the frequency determined by the output of adding circuit 123, which RF mixing circuit 109.

The output of D/A converting circuit 121 is initialized to have a frequency out of the receivable band range of the radio receiver, in order to prevent the tuning signal from RF tuning circuit 106 from adversely affecting the channel selecting operation.

Fine tuning circuit 190 is activated in response to the completion of the channel selection in PLL circuit 113. Fine tuning control circuit 115 outputs sucessively a fine tuning control signal whose amplitude is varied by a predetermined value in response to the completion of the channel selection. The fine tuning control signal is a 6-bit digital signal, for example, and capable of representing 64 levels. The 6-bit digital signal is incremented one by one to be sequentially generated.

The digital control signal is digital-analogue converted by D/A converting circuit 122 and the converted signal is applied to adding circuit 123. Adding circuit 123 receives a fixed frequency control signal through D/A converting circuit 121 from PLL circuit 113.

The output of adding circuit 123 is applied to RF tuning circuit 106. The tuning frequency of RF tuning circuit 106 is changed accordingly in 64 levels with the tuning frequency selected by PLL circuit 113 as a rough tuning signal.

The change of the tuning frequency of RF tuning circuit 106 changes an RF signal level applied to mixing circuit 109, resulting in a change of the IF signal level from IF amplifying circuit 111. The IF signal is applied to field strength detection circuit 114 as a signal indicative of a reception signal field strength. Field strength detection circuit 114 detects the IF signal to output a signal indicative of a reception signal field strength. A/D converting circuit 124 converts the analogue field strength indicating signal to a digital signal which is applied to fine tuning circuit 190.

Fine tuning circuit 190 writes in memory 125 the reception signal field strength data corresponding to each of 64 fine tuning control signals supplied from fine tuning control circuit 115.

Memory 125 includes 64 addresses. Respective 64 addresses store reception signal field strength data corresponding to each of 64 fine tuning control signals.

When the reception signal field strength data corresponding to all the 64 fine tuning control signals have been written in memory 125 the change of the fine tuning control signals is stopped, and maximum value 126 is operated.

Maximum value detection circuit 126 finds the maximum value of the data stored in memory 125. This operation is to find a tuning frequency attaining a maximum level reception signal field strength when the tuning frequency of RF tuning circuit 106 is changed.

When maximum value detection circuit 126 finds the maximum value, the information concerning the fine tuning control signal corresponding to the maximum value data is applied to fine tuning control circuit 115. Fine tuning control circuit 115 finds the corresponding fine tuning control signal based on the maximum value information, which fine tuning control signal is continuously applied to adding circuit 123. As a result, RF tuning circuit 106 is set to an optimum tuning frequency to enter an accurate reception state.

Memory 125, maximum value detection circuit 126 and fine tuning control circuit 115 comprise microcomputer, for example. In this case, with the microcomputers programmed appropriately, it is easy to sequentially generate 64 digital signals from fine tuning control circuit 115 and to store the digital signals from A/D converting circuit 124 in the 64 addresses of memory 125 in correspondence with the respective digital signals.

Maximum value detection circuit 126 finds a maximum value of reception signal field strength data in such algorithm as follows. Data stored in an address N (N is a first address) of memory 125 and data stored in an address (N+1) are compared. The larger data thereof is compared with data in an address (N+2). The same step will be successively repeated to obtain an address M storing the maximum value data.

Fine tuning control circuit 115 selects the fine tuning control signal corresponding to the address M in memory 125 and outputs the same. This is easily achieved by providing in fine tuning control circuit 115 an ROM (read only memory) having 64 addresses and storing fine tuning control signals in the respective addresses.

RF amplifying circuit 102 includes antenna damping circuit 103 and AGC transistor 105. An AGC signal generated from AGC circuit 117 in accordance with a field strength of a reception signal controls an attenuation amount of antenna damping circuit 103 and the amplification rate of AGC transistor 105. The AGC signal consequently controls the gain of RF amplifying circuit 102 in accordance with the reception signal field strength.

Figure 2:
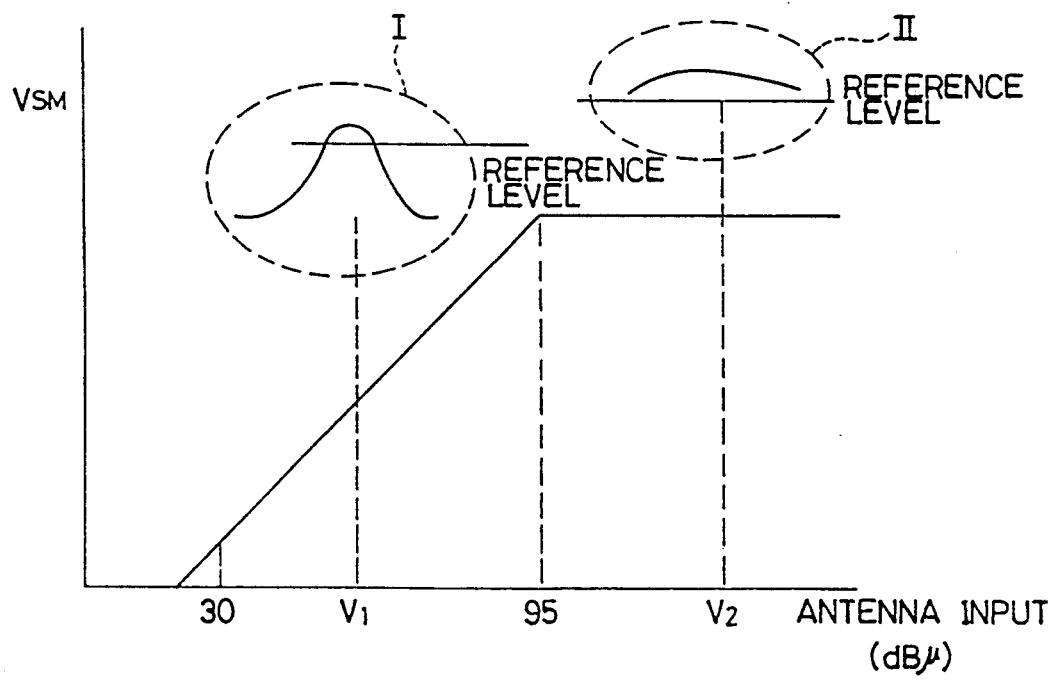
FIG. 2 shows an input/output characteristic of a field strength detecting circuit.

The field strength of the reception signal is detected by field strength detection circuit 114. The field strength detection circuit 114 has such a characteristic as shown in FIG. 2.

When the channel selection state is completed to start a fine tuning operation with the output of field strength detection circuit 114 being saturated, a difference between output data of A/D converting circuit 124 is so small that a maximum value data can not be detected.

Determination circuit 116 is provided to detect an accurate tuning frequency even in such a state. Determination circuit 116 monitors the output of field strength detection circuit 114 (that is, the output of A/D converting circuit 124).

Determination circuit 116 applies to control circuit 118 a fine tuning impossible signal indicating that the reception signal field strength exceeds or equals to the first reference value. Control circuit 118 generates a first control signal in response to the fine tuning impossible signal to set AGC circuit 117 in a forced AGC state.

In the forced AGC state, antenna damping circuit 103 enters the maximum attenuation state, and AGC transistor 105 also provides the maximum attenuation (minimum gain). In this forced AGC state, the gain of RF amplifying circuit 102 is reduced by about 30 dB.

If the reception signal field strength is about 110 dB$\mu$, the forced AGC causes the attenuation of 30 dB, resulting in about 80 dB$\mu$ of the reception signal field strength. If the reception signal field strength is about 80 dB$\mu$, the output of field strength detection circuit 114 is not saturated but changed in response to a change in a tuning frequency as shown in FIG. 2, so that fine tuning control circuit 190 precisely fine-tunes the tuning frequency.

When the field strength of the reception signal is about 140 dB$\mu$, however, even if the attenuation of about 30 dB is caused in the forced AGC state, a change in the output of field strength detection circuit 114 is small to still prevent a precise fine tuning of a tuning frequency.

In a forced AGC state after the generation of the first control signal, if control circuit 118 continuously receives a fine tuning impossible signal from determination circuit 116, it applies a second control signal to local-DX circuit 108.

Figure 6:
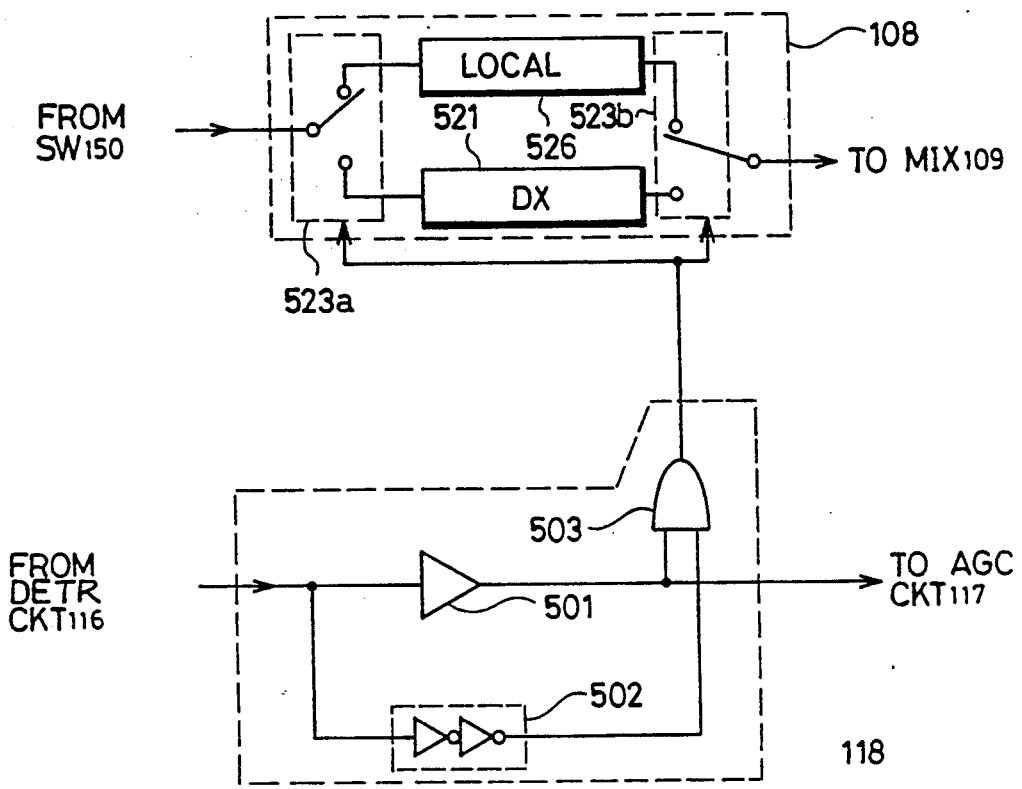
FIG. 6 shows one example of arrangements of the local·DX switching circuit and the control circuit shown in FIG. 5.

As shown in FIG. 6, control circuit 118 as an exemplary arrangement comprises a buffer 501 for generating a forced AGC signal (first AGC signal) in response to the fine tuning impossible signal from determination circuit 116, a delay circuit 502 for delaying the fine tuning impossible signal by a predetermined time and a gate circuit 508 for generating a second control signal through logical product of the outputs of buffer 501 and delay circuit 502. Delay circuit 502 delays the output of determination circuit 116 by a time required for a reception signal field strength to be attenuated after AGC circuit 117 entering a forced AGC state in response to the generation of the first control signal.

Local·DX circuit 108 enters a DX state in response to the second control signal. In the DX state, the RF signal from selection circuit 150 is attenuated by about 30 dB. Local·DX circuit 108 is ordinarily in a local state wherein the output of selection circuit 150 is not attenuated.

As shown in FIG. 6, local·DX circuit 108 comprises a local circuit 520 for passing an applied signal without attenuation, a DX circuit 521 for passing the applied signal with attenuation of about 30 dBμ, a first switch circuit 523a for transmitting a signal from selection circuit 150 to either local circuit 520 or DX circuit 521 in response to the second control signal, and a second switch circuit 523b for transmitting the signal from either local circuit 520 or DX circuit 521 to mixing circuit 169 in response to the second control signal. The first and the second switch circuits 523a and 523b operate in gang control fashion.

Upon the generation of the second control signal, the first and the second switch circuits 523a and 523b select DX circuit 521. When a second control signal is not generated, the first and the second switch circuits 523a and 523b select local circuit 520.

The generation of the second control signal obtains about 60 dB of the total attenuation of about 30 dB of attenuation in RF amplifying circuit 102 and about 30 dB attenuation in local·DX circuit 108. The reception signal field strength 140 dBμ is accordingly attenuated to 80 dBμ to enable a fine tuning of a tuning frequency, as shown in FIG. 2.

AGC circuit 117 generates an AGC signal in response to the wide band RF signal generated by resistor 107 and the output of selection circuit 150. In a channel selecting operation, the output of selecting circuit 150 is a wide band RF signal and AGC circuit 117 performs an AGC operation using only a wide band AGC signal.

At a fine tuning after the completion of the channel selection and at reception after the completion of the fine tuning, AGC circuit 117 performs an AGC operation using a wide band RF signal and a narrow band RF signal.

Now consider a case where an incoming RF signal from antenna 101 includes a desired signal of a low level and an interference signal of a high level. In this case, AGC circuit 117 performs an AGC operation using the interference signal generated by resistor 107. As a result, the gain of RF amplifying circuit 102 is decreased to further reduce the desired signal level.

In such a state, the output signal of the field strength detection circuit 114 is too small to detect a maximum value, that is, to fine tune a tuning frequency in fine tuning after the completion of the channel selection. The following arrangement is employed to prevent such a state.

Determination circuit 116 generates a third control signal and applies the same to sensitivity switching circuit 119 when the output signal level of field strength detection circuit 114 drops below or equals to a second reference value. The second reference value is set near a stop sensitivity (the lowest wide band RF signal level allowing a channel selection, which is about 30 dB).

Sensitivity switching circuit 119 lowers the sensitivity of AGC circuit 117 in response to the third control signal. When the sensitivity is lowered, AGC circuit 117 reduces the AGC function lower than the AGC amount required by a wide band RF signal to increase the gain of RF amplifying circuit 102.

As a result, very small desired signal level is increased to increase the output signal level of field detection circuit 114, enabling a fine tuning of a tuning frequency.

Figure 7:
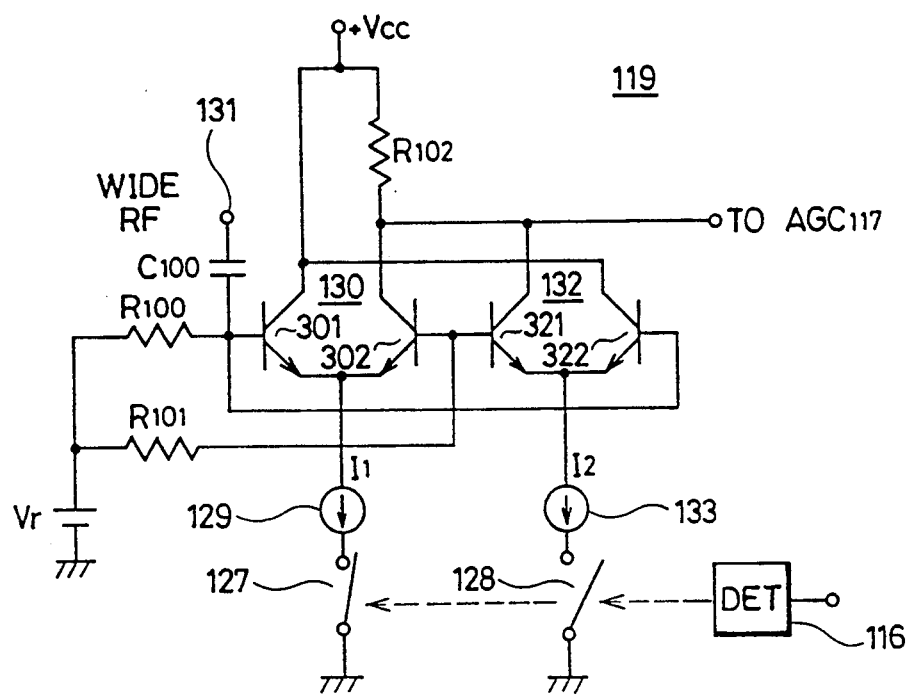
FIG. 7 shows the arrangement of the sensitivity switching circuit shown in FIG. 5.

FIG. 7 shows one embodiment of sensitivity switching circuit 119.

Referring to FIG. 7, sensitivity switching circuits 119 includes first and second amplifying circuits 130 and 132 for amplifying wide band RF signals applied from an input terminal 131 with gains G1 and G2, respectively. First amplifying circuit 130 includes a pair of npn bipolar transistors 301 and 302 having emitters coupled to each other. Second amplifying circuit 132 includes a pair of npn bipolar transistors 321 and 322 having emitters coupled to each other.

Transistors 301 and 322 receive at their bases reference voltage Vr through a resistor R100 and a wide band RF signal through a coupling capacitor C100.

Transistors 302 and 321 receive at their bases reference voltage Vr through a resistor R101. Transistors 301 and 322 have the collectors connected to the power supply voltage +Vcc. Transistors 302 and 321 are connected to the power supply voltage +Vcc through a resistor R102. Transistors 302 and 322 transmits from the common coupled collectors a wide band RF signal to AGC circuit 117.

Sensitivity switching circuit 119 further comprises a first constant current source 129 for extracting a first constant current I1 from the common emitter of first amplifying circuit 130, a second constant current source 133 for extracting a second constant current I2 from the common emitter of second amplifying circuit 132, and switching circuits 127 and 128 for operating either first amplifying circuit 130 or second amplifying circuit 132 in response to the third control signal from determination circuit 116.

The gains G1 and G2 of first and second amplifying circuits 130 and 132 are determined by the first and the second constant currents I1 and I2. It is assumed now that I1>I2, that is, G1>G2.

When the third control signal is applied from determination circuit 116, switching circuit 127 is turned off and switching circuit 128 is turned on, and otherwise the switching circuit 127 is turned on and switching circuit 128 is turned off. The operations thereof will be described.

First and second amplifying circuits 130 and 132 constitute a differential amplifying circuit which amplifies a wide band RF signal received at input terminal 131. If the wide band RF signal level is higher than the reference voltage, transistors 301 and 322 are turned on, and otherwise transistors 302 and 321 are turned on.

The generation of the third control signal from determination circuit 116 turns off switching circuit 127 and turns on switching circuit 128 to operate second amplifying circuit 132. Second amplifying circuit 132 amplifies the wide band RF signal received from input terminal 131 with the gain G2 and transmits the amplified signal to AGC circuit 117.

When a third control signal is not generated, switching circuit 127 is turned on and switching circuit 128 is turned off. First amplifying circuit 130 amplifies the wide band RF signal witht the gain G1 and transmits the amplified signal to AGC circuit 117.

The gain G2 is smaller than the gain G1. Consequently, when a reception signal level is below a second reference value, AGC circuit 117 lowers its detection sensitivity for a signal change (level) to reduce an AGC function.

The setting of forced AGC and switching of detection sensitivity of AGC by using the output signal of determination circuit 116 may be sufficient to be performed at least in a fine tuning period so it may be sufficient that determination circuit 116 is made operative upon the detection of start of a fine tuning operation and non-operative upon the detection of the end of the fine tuning operation.

As the foregoing, according to the present invention, an adjustment effect of an AGC function of an AGC circuit in accordance with a field strength of a reception signal prevents suppression of the sensitivity to the reception signal to allow a reception of a precise channel frequency with maximum sensitivity.

The generation of an AGC signal in response to a wide band RF signal improves cross modulation interference characteristic.

A radio receiver having an automatic channel selecting function prevents an erroneous selection of an interference signal channel, thereby precisely fine tuning a channel frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A channel selection type radio receiver for reproducing a desired signal from a radio frequency incoming signal through an antenna, comprising:
   RF amplifying means for amplifying the radio frequency signal incoming through said antenna,
   means for producing an intermediate frequency signal in response to the amplified radio frequency signal,
   gain controlling means for controlling the gain of said RF amplifying means during channel scanning in accordance with a level of one or both of said wide band radio frequency and intermediate frequency signals;
   means for extracting said desired signal from said incoming radio frequency signal, and producing a narrow band signal corresponding thereto;
   first controlling means for controlling the control degree of said gain controlling means in accordance with the field strength of said desired signal upon extraction thereof,
   second controlling means responsive to an externally applied channel selection instruction signal during channel selection for rendering said first controlling means non- operative during scanning channel selection to effect automatic gain control action by said gain control means according to the level of one of the radio frequency signal and the intermediate frequency signal of relatively wide band and, upon reception of the desired signal, to enable said first controlling means so as to effect automatic gain control operation according to the intermediate frequency signal of relatively wide band and the level of the narrow band signal corresponding to the extracted desired signal field strength.

2. The radio receiver according to claim 1, wherein said first controlling means includes means for reducing the control degree of said gain controlling means as the field strength of said desired signal decreases.

3. The radio receiver according to claim 1, wherein said desired signal extracting means includes:
   means for generating an oscillating signal having a variable frequency,
   means for mixing said radio frequency signal with said oscillating signal to generate an intermediate frequency signal of a relative wide band,
   means for producing a narrow band intermediate frequency signal from said relatively wide band intermediate frequency signal in response to selection of the desired signal, and wherein
   said gain controlling means receives signals each indicative of the field strength of the respective intermediate frequency signals of a relatively wide band and narrow band.

4. The radio receiver according to claim 1, wherein said first controlling means comprises:
   means for detecting the field strength of said desired signal,
   means for detecting that the output signal level of said field strength detecting means is greater than or equal to a predetermined reference value and
   means responsive to the output of said level determining means for controlling said gain controlling means such that the gain of said RF amplifying means is minimized.

5. The radio receiver according to claim 1, wherein said first controlling means comprises:
   means for detecting the field strength of said desired signal,
   means for detecting that the output signal level of said field strength detecting means is less than or equal to a predetermined reference value, and
   means responsive to the output of said level determining means for reducing the sensitivity of said gain controlling means to the field strength of said radio frequency signal.

6. A radio receiver which receives an incoming radio frequency signal from an antenna and wherein an automatic channel selection is carried out by changing an oscillating frequency of a local oscillating circuit in response to an external instruction of a channel selection and the automatic channel section is stopped when a desired signal level greater than or equal to a predetermined level is detected, the radio receiver comprising:
   RF tuning circuit means having a tuning frequency set to the frequency of said desired signal at the completion of said channel selection, said RF tuning circuit means extracting a signal tuned to said tuning frequency from the incoming radio frequency signal,
   circuit means for generating said desired signal from the output signal of said RF tuning circuit,
   adjusting circuit means responsive to a stop of said automatic channel selection for adjusting the tuning frequency of said RF tuning circuit by changing the tuning frequency of said RF tuning circuit to maximize the field strength of said desired signal,
   field strength detecting means for detecting the field strength of said desired signal,
   RF amplifying means for amplifying said incoming radio frequency and transmitting the amplified signal to said RF tuning circuit,
   AGC circuit means for forcedly setting the gain of said RF amplifying circuit to the minimum value at least during the adjusting by said adjusting circuit means in response to the detection by said field strength detecting means that the field strength of said desired signal is equal to or greater than a first reference value, said AGC circuit means controlling the gain of said RF amplifying circuit in response to the field strength of said radio frequency signal, and means for reducing the sensitivity of said AGC circuit means to said radio frequency signal at least during the adjusting by said adjusting circuit means in response to the detection by said field strength detecting means that the field strength of said desired signal is less than or equal to a second reference value.

7. The radio receiver according to claim 6, further including attenuation means for attenuating the output of said RF tuning circuit by a predetermined value when the field strength of the desired signal exceeds the first reference value even after the operation of said AGC circuit means.

8. A channel selection type radio receiver for reproducing a desired signal from a radio frequency incoming signal through an antenna, comprising:

RF amplifying means for amplifying the radio frequency signal incoming through said antenna, means for producing an intermediate frequency signal in response to the amplified radio frequency signal, gain controlling means for controlling the gain of said RF amplifying means during channel selection in accordance with a level of one of the radio frequency signal and an intermediate frequency signal of a relatively wide band, means for extracting said desired signal from said incoming radio frequency signal, first controlling means for controlling the control degree of said gain controlling means in accordance with the field strength of said desired signal, wherein said first controlling means comprises:

means for detecting the field strength of said desired signal, means for detecting that the output signal level of said field strength detecting means is greater than or equal to a predetermined reference value, first means responsive to the output of said level determining means for controlling the output of said gain controlling means to reduce the gain of said RF amplifying means, and second means responsive to the output of said level determining means after the operation of said first means for further reducing the gain of said RF amplifying means.

9. A channel selection type radio receiver for reproducing a desired signal from a radio frequency incoming signal through an antenna, comprising:

RF amplifying means for amplifying the radio frequency signal incoming through said antenna, means for producing an intermediate frequency signal in response to the amplified radio frequency signal, gain controlling means for controlling the gain of said RF amplifying means during channel selection in accordance with a level of one of a radio frequency signal and an intermediate frequency signal of a relatively wide band, means for extracting said desired signal from said incoming radio frequency signal, first controlling means for controlling the control degree of said gain controlling means in accordance with the field strength of said desired signal, wherein said first controlling means comprises:

means for detecting the field strength of said desired signal, means for detecting that the output signal level of said field strength detecting means is less than or equal to a predetermined reference value, means responsive to the output of said level determining means for reducing the sensitivity of said gain controlling means to the field strength of said radio frequency signal, said sensitivity reducing means comprising:

first amplifying means for amplifying said radio frequency signal at a first amplification level, second amplifying means for amplifying said radio frequency signal at a second amplification level which is smaller than said first amplification level, and means response to the output of said level determining means for selectively activating one of said first and second amplifying means to transmit the output of the activated amplifying means as a signal indicative of the field strength of said radio frequency signal to said gain controlling means.

10. A radio receiver for reproducing a desired signal from a radio frequency signal incoming through an antenna, comprising:

RF amplifying means for amplifying the radio frequency signal incoming through said antenna, gain controlling means for controlling the amplification of said RF amplifying means in accordance with a level of one of a radio frequency signal and an intermediate frequency signal of a relatively wide band, extracting means for extracting said desired signal from said incoming radio frequency signal, first controlling means for controlling the control degree of control of said amplification by said gain controlling means in accordance with the field strength of said desired signal, second controlling means responsive to an externally applied channel selection instruction signal during channel selection for rendering said first controlling means non-operative, whereby upon reception of the desired signal, the first controlling means controls the gain controlling means to implement a gain control according to the level of the desired signal, while during channel selection, the gain controlling means effects a wide band automatic gain control action according to the level of the radio frequency or the intermediate frequency signal, said gain controlling means comprising a first transistor element having a base receiving the incoming signal and a collector generating an AGC control signal to said RF amplifying means, and said first controlling means comprising:

a second transistor element having an emitter coupled to ground potential and a collector coupled to an emitter of said first transistor element, and first means for controlling a potential of the base of said second transistor element in accordance with the field strength of said desired signal, and said second controlling means comprising means for forcedly rendering said first means non-operative.

* * * * *